US 9,099,978 B2

(12) United States Patent
Li et al.

(10) Patent No.: US 9,099,978 B2
(45) Date of Patent: Aug. 4, 2015

(54) EMBEDDED SPEAKER PROTECTION FOR AUTOMOTIVE AUDIO POWER AMPLIFIER

(71) Applicants: STMicroelectronics (Shenzhen) R&D CO. LTD., Shenzhen (CN); STMicroelectronics, S.r.l., Agrate Brianza (MB) (IT)

(72) Inventors: XiangSheng Li, Shenzhen (CN); Cristiano Meroni, Milan (IT); Mei Yang, Shenzhen (CN); XianFeng Xiong, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 354 days.

(21) Appl. No.: 13/692,789

(22) Filed: Dec. 3, 2012

(65) Prior Publication Data

US 2013/0188793 A1 Jul. 25, 2013

(30) Foreign Application Priority Data

Dec. 30, 2011 (CN) .......................... 2011 1 0461473

(51) Int. Cl.
| | |
|---|---|
| *H03G 11/00* | (2006.01) |
| *H03F 1/52* | (2006.01) |
| *H03G 3/34* | (2006.01) |
| *H03F 3/21* | (2006.01) |

(52) U.S. Cl.
CPC ................ *H03G 11/00* (2013.01); *H03F 1/52* (2013.01); *H03F 3/21* (2013.01); *H03G 3/348* (2013.01)

(58) Field of Classification Search
None
See application file for complete search history.

(56) References Cited

U.S. PATENT DOCUMENTS

| | | | | |
|---|---|---|---|---|
| 4,034,268 | A | * | 7/1977 | Klauck .......................... 361/111 |
| 4,301,330 | A | * | 11/1981 | Trump ............................. 381/55 |
| 5,815,584 | A | | 9/1998 | Whitecar et al. |
| 7,692,488 | B2 | * | 4/2010 | Wong et al. .................... 330/251 |
| 2002/0149422 | A1 | * | 10/2002 | Vermeeren ......................... 330/9 |
| 2003/0160653 | A1 | * | 8/2003 | Hasegawa ........................ 330/51 |
| 2011/0055877 | A1 | * | 3/2011 | Lesso ............................. 381/121 |
| 2012/0154032 | A1 | * | 6/2012 | Lesso ............................. 330/109 |

FOREIGN PATENT DOCUMENTS

| | | |
|---|---|---|
| CN | 1684359 | 10/2005 |
| CN | 201910249 | 7/2011 |
| CN | 202799077 | 3/2013 |

* cited by examiner

*Primary Examiner* — Thang Tran
(74) *Attorney, Agent, or Firm* — Allen, Dyer, Doppelt, Milbrath & Gilchrist, P.A.

(57) ABSTRACT

A method of operating a speaker system including a speaker coupled to an amplifier, and a dedicated digital speaker protection circuit includes turning on the amplifier in a mute mode, after a first delay period, issuing a play command to the amplifier to place the amplifier in a play mode, but without an input signal during a second delay period, and performing a speaker offset detection during the second delay period, wherein, if there is an offset, then the amplifier is forced back into the mute mode, and if there is no offset, then the amplifier is allowed to continue to operate in the play mode. The method also includes issuing a speaker protection control signal or command if an offset is detected.

7 Claims, 4 Drawing Sheets

EMBEDDED SPEAKER PROTECTION FOR AUTOMOTIVE AUDIO POWER AMPLIFIER

RELATED APPLICATION

This application is a translation of and claims the priority benefit of Chinese patent application number 201110461473.8, filed on Dec. 30, 2011, entitled Embedded Speaker Protection For Automotive Audio Power Amplifier, which is hereby incorporated by reference to the maximum extent allowable by law.

FIELD OF THE INVENTION

The present invention relates to audio speaker protection, and, more particularly to an embedded speaker protection method and circuit embodiment thereof for an automotive audio power amplifier, which can protect the speakers automatically in case of high offset during a turn-on procedure.

BACKGROUND OF THE INVENTION

In automotive power amplifier devices an offset detector function is normally embedded. Any DC output offset exceeding ±2V is signaled out no matter if there is an input signal or not. This abnormal offset, when there is no input signal, might occur as a consequence of initially defective or aged and worn-out input capacitors feeding a DC component to the input. The abnormal offset can put the speakers at risk of overheating, or damage the speakers directly.

In current applications of automotive audio power amplifiers, if an audio system is to protect the speakers in case of high output offset, an MCU (microprocessor) must first read the offset detector outputs from the amplifier, and put the amplifier in a mute mode if a high offset is detected. All these actions require extra MCU operations and are controlled outside of the power amplifier IC.

To read the information given by the power amplifier (for example in the TDA7563B quad power amplifier) the diagnosis has to be performed with a low-level output AC signal (or Vin=0). An MCU enables the offset detection by setting an I²C command IB1D<5>=1 and then reads the status of the amplifier after a selectable testing time. An excess offset greater than ±2V is signaled out if it is persistent throughout the assigned testing time. The MCU then can decide to turn off or mute the power amplifier, or just do nothing.

If the MCU ignores all the operations described above, the power amplifier may maintain play mode with a high offset feeding to the speakers without any protections, which is undesirable for the reasons given above.

Referring now to FIG. 1, a flow chart 100 shows the turn-on sequence for the prior art amplifier described above. An MCU enables the offset detection, and sets the IBID<5> bit to a logic one at step 102. The MCU then reads the offset status at step 104. A decision block 106 asks whether or not the offset read is greater than two volts. If no, then the audio amplifier maintains its current working state at step 108. If yes, then the MCU sends a mute command to the amplifier, or simply turns the amplifier off at step 110.

Referring now to FIG. 2, a plot of the voltage at the two speaker output terminals 202 and 204 is shown in a turn-on procedure in the case of an abnormal offset without MCU intervention according to the prior art. The step function in traces 202 and 204 are caused by the abnormal offset in the speaker system.

What is desired is a more direct method and corresponding circuit apparatus for providing the prior art functionality more quickly, and without incurring the extra MCU cycles described above.

SUMMARY OF THE INVENTION

According to the present invention a method of operating a speaker system including a speaker coupled to an amplifier, and a dedicated digital speaker protection circuit comprises turning on the amplifier in a mute mode, after a first delay period, issuing a play command to the amplifier to place the amplifier in a play mode, but without an input signal during a second delay period, and performing a speaker offset detection during the second delay period, wherein, if there is an offset, then the amplifier is forced back into the mute mode, and if there is no offset, then the amplifier is allowed to continue to operate in the play mode. A microprocessor issues a command to place the amplifier in the mute and play modes. The first delay period is about a second. And the second delay period is about 100 milliseconds. Forcing the amplifier back into the mute mode is accomplished by the dedicated digital circuit associated with the amplifier. The offset detection comprises a detection of a threshold offset greater than about two volts. The method of the present invention further comprises issuing a speaker protection control signal or command if an offset is detected.

A speaker system according to the present invention comprises a speaker coupled to an amplifier, an offset comparator coupled to the speaker for providing an offset control signal, a digital circuit having a first input coupled to an output of the offset comparator, a second input for receiving an amplifier control signal, a third input for receiving a play control signal, and an output for providing a forced mute signal, and a microprocessor for controlling the amplifier.

The digital circuit comprises an intermediate node for providing a speaker protection control signal, a first latch for receiving the offset control signal, a first logic gate for receiving the play control signal, the offset control signal, and the speaker protection control signal, a second logic gate coupled to the first latch for receiving the play control signal and the speaker protection control signal, a second latch coupled to the first logic gate for providing the forced mute signal, and a third latch coupled to the second logic gate and to the intermediate node. The first, second, and third latches are clocked by the amplifier control signal. The first, second, and third latches comprise D-type flip flops. The first and second logic gates comprise three-input NAND gates.

DETAILED DESCRIPTION

According to the present invention, a speaker protection function is embedded inside the power amplifier device itself, by means of a dedicated digital circuit.

Figure 1:
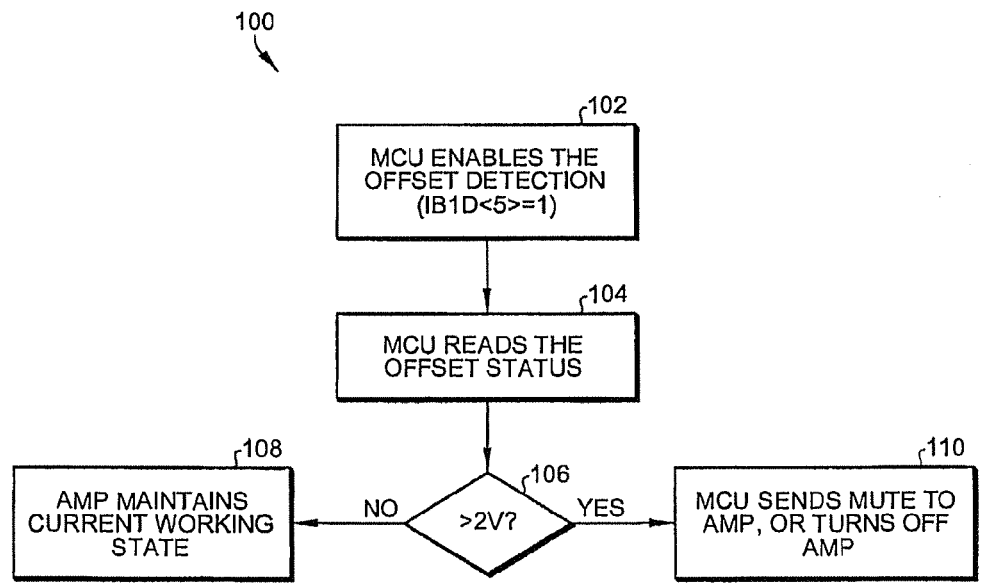
FIG. 1 is a flowchart of a speaker protection procedure according to the prior art.
Figure 2:
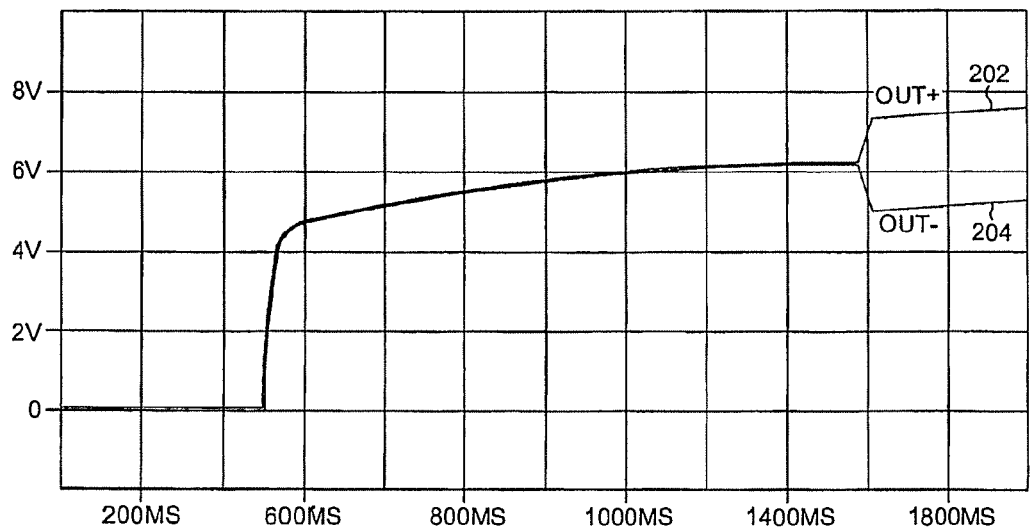
FIG. 2 is a plot of the voltage at the two speaker output terminals in a turn-on procedure in the case of an abnormal offset without MCU intervention according to the prior art.
Figure 3A:
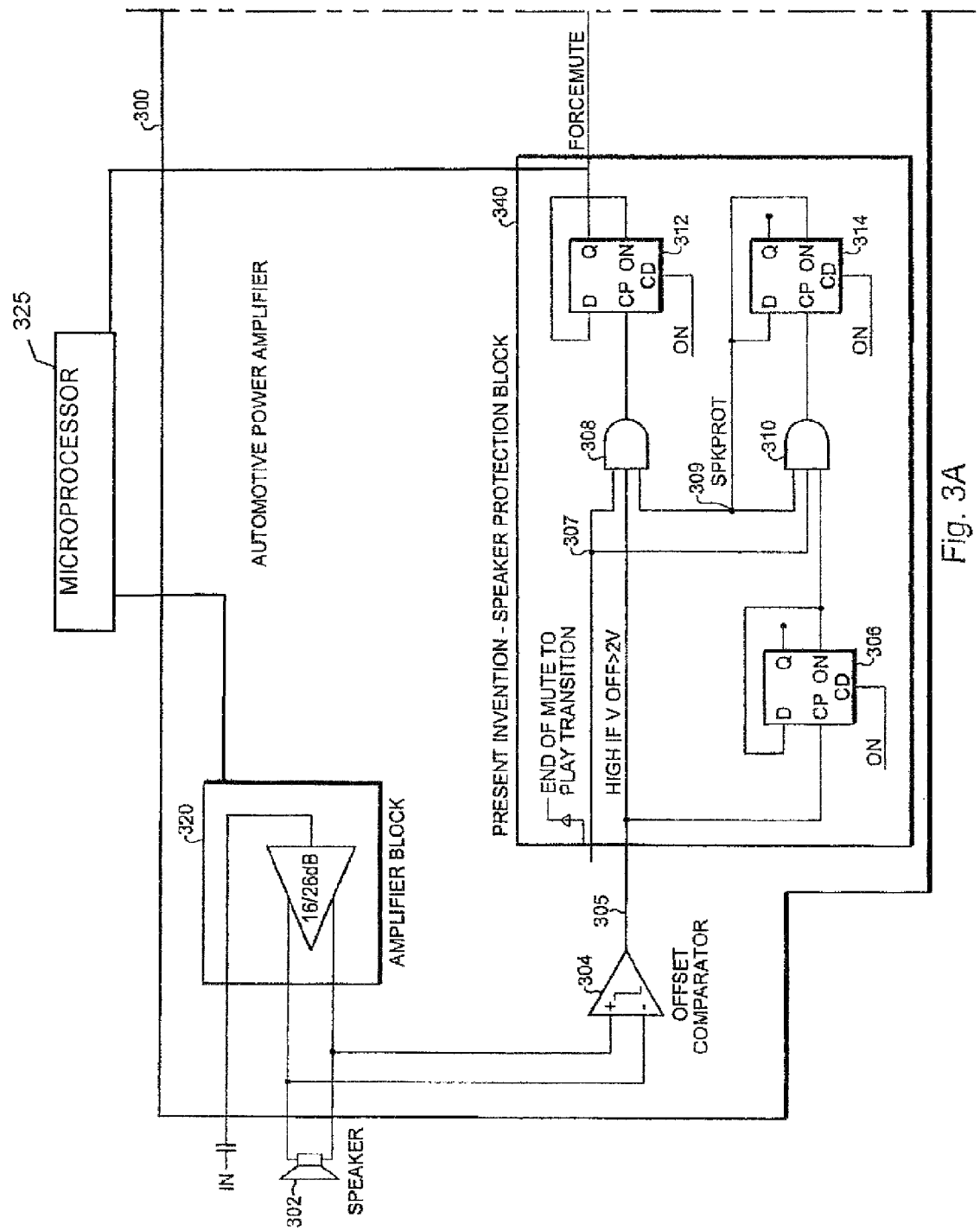
FIGS. 3A and 3B taken together is a simplified circuit diagram for a dedicated digital speaker protection according to the present invention.
Figure 3B:
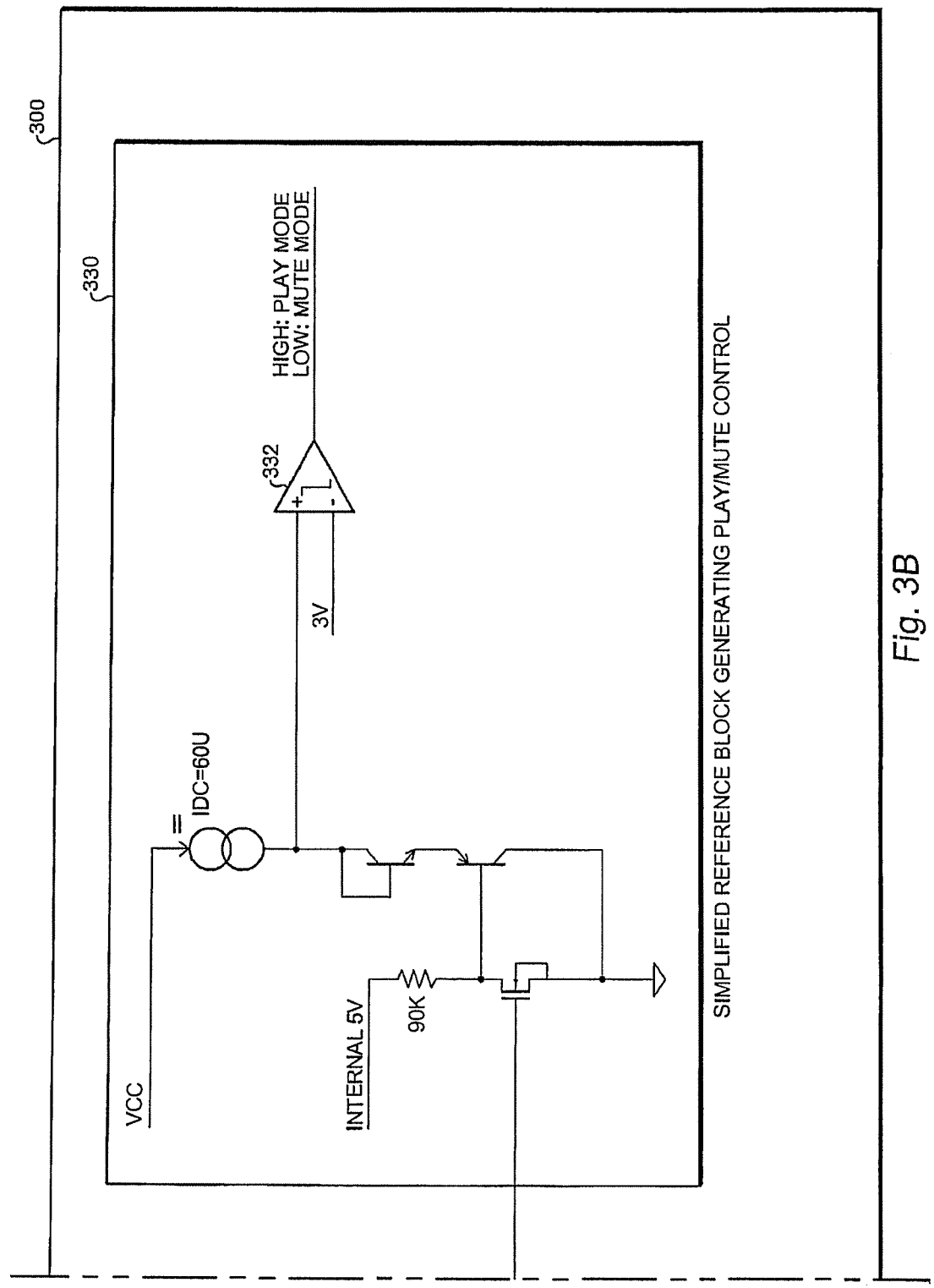

A simplified circuit diagram for the digital circuit 340 that provides the speaker protection function is shown in FIGS. 3A and 3B, which is split into two parts for sake of clarity. The flip-flop enabling signal ON goes high when the amplifier is turned on.

The FORCEMUTE signal goes to the reference block 330 to control the mute state of the whole amplifier 320. In the reference block 330, if FORCEMUTE is high, a low output is provided by the play/mute comparator 332.

A speaker system 300 includes a speaker 302 coupled to an amplifier, an offset comparator 304 coupled to the speaker for providing an offset control signal at node 305, a digital circuit (306, 308, 310, 312, 314) having a first input coupled to an output of the offset comparator 304, a second input for receiving an amplifier control signal (ON), a third input for receiving a play control signal at node 307, and an output for providing a forced mute signal (FORCEMUTE), and a microprocessor (MCU) 325 for controlling the amplifier.

The digital circuit includes an intermediate node 309 for providing a speaker protection control signal (SPKPROT), a first latch 306 for receiving the offset control signal at node 305, a first logic gate 308 for receiving the play control signal at node 307, the offset control signal at node 305, and the speaker protection control signal SPKPROT, a second logic gate 310 coupled to the first latch 306 for receiving the play control signal and the speaker protection control signal, a second latch 312 coupled to the first logic gate 308 for providing the forced mute signal FORCEMUTE, and a third latch 314 coupled to the second logic gate 310 and to the intermediate node 309.

The first, second, and third latches 306, 312, and 314 are D-type flip-flops clocked by the amplifier control signal (ON), wherein the inverted Q output is coupled to the D-input. CP is the positive edge triggered clock input and CD is the clear active low input, which clears the output when it is low. The first and second logic gates 308, 310 are three-input NAND gates.

The speaker protection method of the present invention is described below:

The power amplifier generates two internal signals, namely SPKPROT and FORCEMUTE.

The MCU turns on the amplifier in mute mode, and SPKPROT signal is latched high.

After about one second, the MCU sends a PLAY command to the amplifier, and makes sure no signal is applied to the inputs of the amplifier for about 100 ms.

After the MUTE to PLAY transition time (which is about 40 ms) the amplifier checks the output offset status using internal comparators and:

if there is high offset and SPKPROT=1, FORCEMUTE is latched high and the amplifier forces itself back into MUTE mode, and SPKPROT remains at a logic one. A bit of an I²C bus output is set to a logic one to inform the speaker system that the speaker protection is triggered. The MUTE mode is locked and can be reset only when MCU turns off the amplifier by the I²C bus.

if there is no offset greater than two volts, and SPKPROT=1, FORCEMUTE is latched low which allows amplifier to work in PLAY mode and SPKPROT is reset to a logic zero, which keeps the new speaker protection function inactive in order not to mute the output in case an input signal is applied.

The new embedded speaker protection according to the present invention requires the MCU to turn on the audio power amplifier in a proper sequence. The MCU should first turn on the device in MUTE condition and, after a suitable time for the device to fully work, send a PLAY command to the device and make sure there is no input signal applied to any of the inputs for at least 100 ms.

If the MCU turns on the amplifier directly to play mode without enough setting time for the amplifier to be stable, the speaker protection mechanism of the present invention may not work.

If there is external signal applied to any of the amplifier inputs during this turn-on phase, the new speaker protection mechanism may give an improper mute instruction to the amplifier itself.

Figure 4:
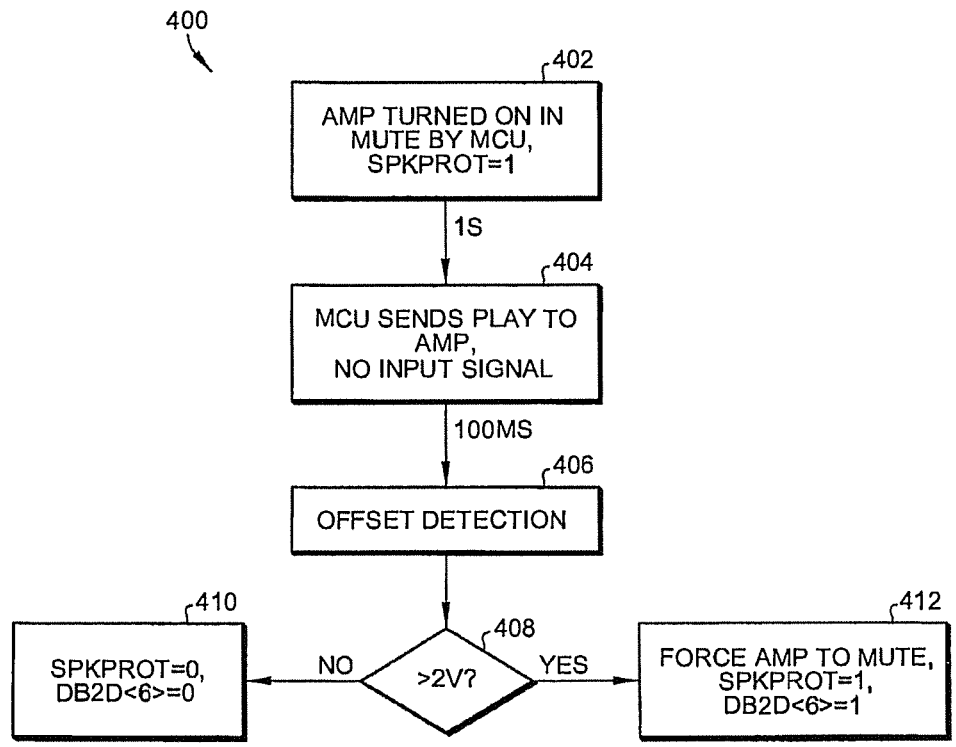
FIG. 4 is a flowchart of a speaker protection procedure according to the present invention.

Referring now to FIG. 4, the method 400 of operating a speaker system including a speaker coupled to an amplifier, comprises turning on the amplifier in a mute mode 402, after a first delay period, issuing a play command to the amplifier to place the amplifier in a play mode, but without an input signal during a second delay period 404, and performing a speaker offset detection 406 during the second delay period, wherein, if there is an offset, then the amplifier is forced back into the mute mode 412, and if there is no offset, then the amplifier is allowed to continue to operate in the play mode 410. A microprocessor issues a command to place the amplifier in the mute mode and the play mode. Forcing the amplifier back into the mute mode is accomplished by the dedicated digital circuit in the amplifier, which is shown in FIG. 3. The offset detection comprises a detection of a threshold offset greater than about two volts. The method of the present invention further comprises issuing a speaker protection control signal or command if an offset is detected.

Figure 5:
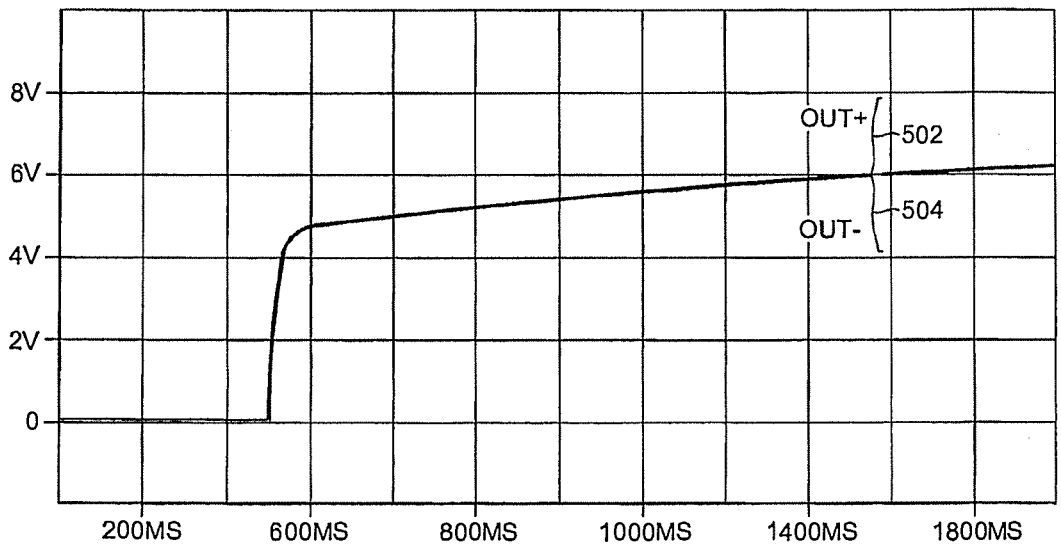
FIG. 5 is a plot of the voltage at the two speaker output terminals in which the amplifier is quickly muted after the detection of a high offset condition, according to the present invention.

The results of the speaker protection method of the present invention is verified in FIG. 5. FIG. 5 shows that the device is set to PLAY about one second after turn-on. After the MUTE to PLAY transition the device detects a high offset which is above two volts and then mutes itself. Note that speaker output terminals 502 and 504 show a glitch when the offset is detected, which is quickly suppressed before any damage can occur to the speaker (or speakers).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A speaker system comprising:
    a speaker coupled to an amplifier;
    an offset comparator coupled to the speaker for providing an offset control signal;
    a digital circuit having a first input coupled to an output of the offset comparator, a second input for receiving an amplifier control signal, a third input for receiving a play control signal, and an output for providing a forced mute signal; and
    a microprocessor coupled to the digital circuit to receive the forced mute signal for controlling the amplifier.

2. The speaker system of claim 1, wherein the digital circuit comprises a plurality of D-type flip flops.

3. The speaker system of claim 1, wherein the digital circuit comprises a plurality of AND gates.

4. The speaker system of claim 1, wherein the digital circuit comprises:

an intermediate node for providing a speaker protection control signal;

a first latch for receiving the offset control signal;

a first logic gate for receiving the play control signal, the offset control signal, and the speaker protection control signal;

a second logic gate coupled to the first latch for receiving the play control signal and the speaker protection control signal;

a second latch coupled to the first logic gate for providing the forced mute signal; and a third latch coupled to the second logic gate and to the intermediate node.

5. The speaker system of claim 4, wherein the first, second, and third latches are clocked by the amplifier control signal.

6. The speaker system of claim 4, wherein the first, second, and third latches comprise D-type flip flops.

7. The speaker system of claim 4, wherein the first and second logic gates comprise three-input NAND gates.

\* \* \* \* \*